United States Patent
Tsutsumi et al.

(10) Patent No.: US 7,892,969 B2
(45) Date of Patent: Feb. 22, 2011

(54) METHOD OF MANUFACTURING SEMICONDUCTOR DEVICE

(75) Inventors: Masanori Tsutsumi, Kawasaki (JP); Jusuke Ogura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 80 days.

(21) Appl. No.: 12/333,716

(22) Filed: Dec. 12, 2008

(65) Prior Publication Data

US 2009/0163029 A1 Jun. 25, 2009

(30) Foreign Application Priority Data

Dec. 21, 2007 (JP) ............................. 2007-329860

(51) Int. Cl.
*H01L 21/4763* (2006.01)
(52) U.S. Cl. ...................... 438/640; 438/637; 438/700; 438/668; 438/738; 438/740; 438/638; 257/E21.577
(58) Field of Classification Search ................ 438/668, 438/738, 740, 640, 637, 638, 700; 257/E21.577
See application file for complete search history.

(56) References Cited

U.S. PATENT DOCUMENTS 6,232,225 B1 * 5/2001 Pong et al. .................. 438/640
2006/0121721 A1 * 6/2006 Lee et al. .................... 438/618
2006/0281313 A1 * 12/2006 Chou et al. ................. 438/689

FOREIGN PATENT DOCUMENTS

| JP | 2001-332510 A | 11/2001 |
|----|---------------|---------|
| JP | 2005-136097 A | 5/2005 |
| JP | 2005-229052 A | 8/2005 |

* cited by examiner

*Primary Examiner*—Andy Huynh
*Assistant Examiner*—Aaron A Dehne
(74) *Attorney, Agent, or Firm*—Westerman, Hattori, Daniels & Adrian, LLP (57) ABSTRACT

A method of manufacturing a semiconductor device has forming a first nitride layer over a substrate, forming a first oxide layer on the first nitride layer, forming a second nitride layer on the first oxide layer, forming a photoresist layer over the second nitride layer, forming a opening in the photoresist layer, etching the second nitride layer using the photoresist layer as a mask such that the opening is reached to the first oxide layer, etching the first oxide layer using the second nitride layer as a mask such that the opening is reached to the first nitride layer, etching the first oxide layer such that bottom zone of the opening is increased in diameter, and etching the first nitride layer using the first oxide layer as a mask such that the opening is reached to the substrate thereby to form contact hole reaching to the substrate.

10 Claims, 13 Drawing Sheets

METHOD OF MANUFACTURING SEMICONDUCTOR DEVICE

CROSS-REFERENCE TO RELATED APPLICATION

This application is based upon and claims the benefit of priority of the prior Japanese Patent Application No. 2007-329860 filed on Dec. 21, 2007, the entire contents of which are incorporated herein by reference.

BACKGROUND

1. Field

An aspect of the embodiments discussed herein is directed to a method of manufacturing a semiconductor device.

2. Description of the Related Art

A method of manufacturing a conventional semiconductor device is described below.

A transistor including a gate electrode and source/drain diffusion regions is formed on a semiconductor substrate. An interlayer insulating layer is formed on the semiconductor substrate so as to reach over the transistor. A photoresist layer is formed on the interlayer insulating layer. Openings are formed in the photoresist layer by photolithography. Contact holes are formed in the interlayer insulating layer by dry etching so as to reach to the source/drain diffusion regions. Conductive plugs are provided in the contact holes. Interconnects are formed on the interlayer insulating layer so as to be connected to the conductive plugs.

The conventional semiconductor device is manufactured as discussed above.

The packing density of recent semiconductor devices is high; hence, components of the recent semiconductor devices need to have a small size and contact holes need to have a small diameter. The prior arts regarding to the manufacturing method how to form conductive plugs in the insulating layer formed by the nitride layer and the oxide layer are known in the patent documents as follows: Japanese Laid-open Patent Publication No. 2005-136097, Japanese Laid-open Patent Publication No. 2005-229052 and Japanese Laid-open Patent Publication No. 2001-332510.

The reduction in the diameter of contact holes requires precisely forming the contact holes; hence, it is desirable to keep the yield and/or reliability of products high.

SUMMARY

According to an aspect of the embodiment, a method of manufacturing a semiconductor device has forming a first nitride layer over a substrate, forming a first oxide layer on the first nitride layer, forming a second nitride layer on the first oxide layer, forming a photoresist layer over the second nitride layer, forming a opening in the photoresist layer, etching the second nitride layer using the photoresist layer as a mask such that the opening is reached to the first oxide layer, etching the first oxide layer using the second nitride layer as a mask such that the opening is reached to the first nitride layer, etching the first oxide layer such that bottom zone of the opening is increased in diameter, and etching the first nitride layer using the first oxide layer as a mask such that the opening is reached to the substrate thereby to form contact hole reaching to the substrate.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

A method of manufacturing a semiconductor device according to an embodiment will now be described with reference to FIGS. 1A to 1C and FIG. 2 to FIG. 16. FIGS. 1A to 1C and FIG. 2 to FIG. 9 are sectional views illustrating operations of the method of manufacturing the semiconductor device.

Figure 1A:
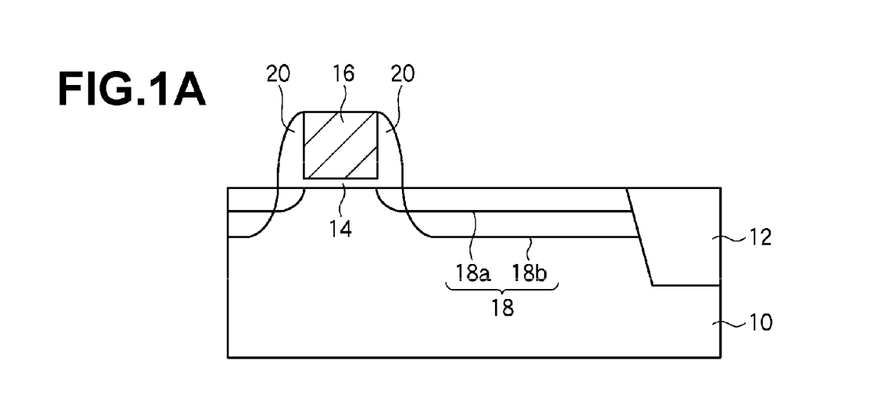
FIGS. 1A-1C are sectional views illustrating operations of a method of manufacturing a semiconductor device according to an embodiment.

As illustrated in FIG. 1A, an isolation region 12 for defining an element region is formed in a semiconductor substrate 10 made of, for example, silicon. The isolation region 12 may be formed by, for example, a shallow trench isolation (STI) process.

A gate insulating layer 14 with a thickness of, for example, 1 nm to 20 nm is formed over the semiconductor substrate 10. The gate insulating layer 14 may be formed by, for example, a thermal oxidation process.

A polysilicon layer with a thickness of, for example, 50 nm to 150 nm is formed over the gate insulating layer 14. The polysilicon layer is patterned by photolithography so as to have a shape corresponding to the shape of a gate electrode 16. For example, isotropic dry etching is used to pattern the polysilicon layer. The gate electrode 16 is obtained as described above.

Portions of the semiconductor substrate 10 that are located on both sides of the gate electrode 16 are doped with a dopant impurity by, for example, ion implantation using the gate electrode 16 as a mask. This converts the portions of the semiconductor substrate 10 that are located on both sides of the gate electrode 16 into upper impurity diffusion regions 18a for forming an extension source/drain structure.

A silicon dioxide layer with a thickness of, for example, 10 nm to 50 nm is formed over the semiconductor substrate 10 by, for example, a chemical vapor deposition (CVD) process.

The silicon dioxide layer is isotropically etched. This allows a sidewall insulating layer 20 made of silicon dioxide to be formed on a sidewall of the gate electrode 16.

The semiconductor substrate 10 is doped with the dopant impurity by, for example, ion implantation using a gate electrode 16 and the sidewall insulating layer 20 as a mask. This allows lower impurity diffusion regions 18b for forming the extension source/drain structure to be formed in portions of the semiconductor substrate 10 that are located on both sides of the gate electrode 16, which carries the sidewall insulating layer 20 disposed on the sidewall thereof. The upper impurity diffusion regions 18a and the lower impurity diffusion regions 18b form source/drain diffusion layers 18 having the extension source/drain structure.

The source/drain diffusion layers 18 are heat-treated by, for example, a rapid thermal annealing (RTA) process such that the dopant impurity contained therein is activated.

Figure 1B:
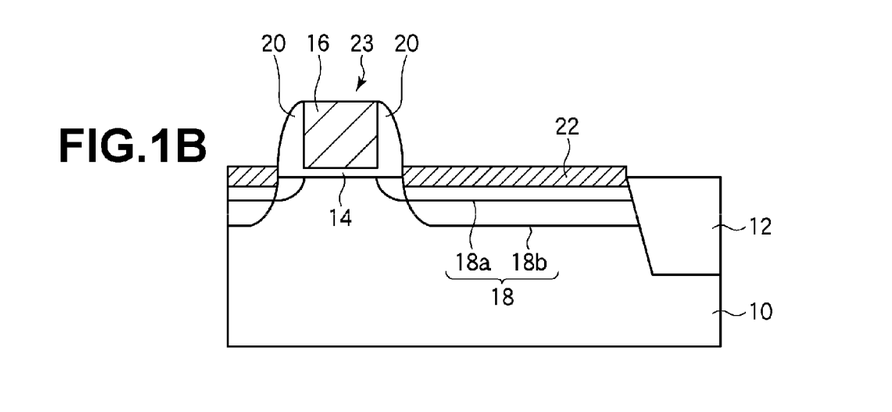

A metal layer made of a high-melting point metal such as Co is formed over the semiconductor substrate 10. The metal layer has a thickness of, for example, 1 nm to 30 nm.

The semiconductor substrate 10 is heat-treated such that Co in the metal layer reacts with Si in the semiconductor substrate 10. This allows a metal silicide layer made of cobalt silicide to be formed. Portions of the metal layer that have not reacted with Si are etched off. This allows source/drain electrodes 22 made from the metal silicide layer to be provided on the source/drain diffusion layers 18 as illustrated in FIG. 1B. The source/drain electrodes 22 have a thickness of, for example, 1 nm to 40 nm.

A transistor 23 including the gate electrode 16 and the source/drain diffusion layers 18 is obtained by the above procedure.

Figure 1C:
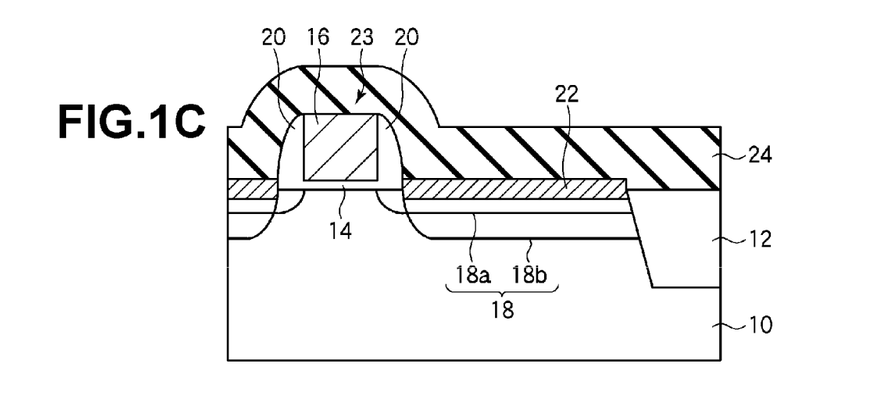

As illustrated in FIG. 1C, a silicon nitride layer (first silicon nitride layer) 24 is formed over the semiconductor substrate 10 by, for example, a CVD process. The silicon nitride layer 24 has a thickness of, for example, 60 nm.

Figure 2:
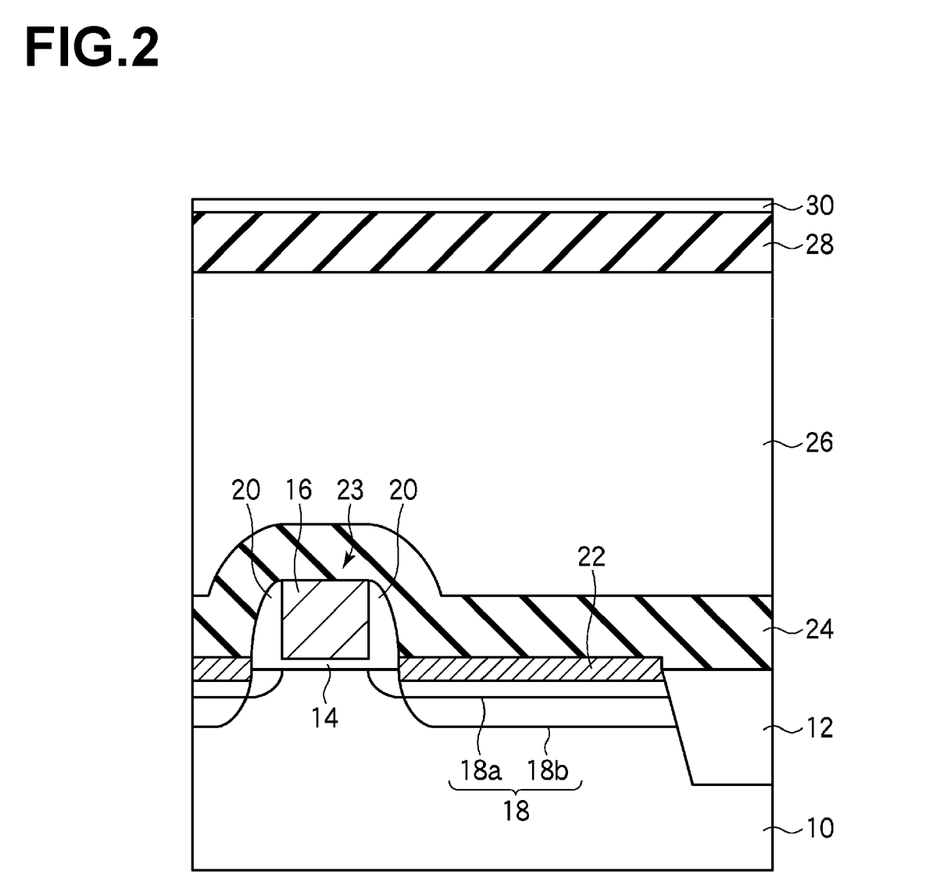
FIG. 2 is a sectional view illustrating an operation of the semiconductor device-manufacturing method.

As illustrated in FIG. 2, a silicon dioxide layer (first silicon dioxide layer) 26 is formed over the silicon nitride layer 24 by, for example, a CVD process. The silicon dioxide layer 26 has a thickness of, for example, 260 nm.

A silicon nitride layer (second silicon nitride layer) 28 is formed over the silicon dioxide layer 26 by, for example, a CVD process. The silicon nitride layer 28 has a thickness of, for example, 60 nm. The silicon nitride layer 28 is used as a hard mask for etching the silicon dioxide layer 26.

A silicon dioxide layer (second silicon dioxide layer) 30 is formed over the silicon nitride layer 28 by, for example, a CVD process. The silicon nitride layer 28 has a thickness of, for example, 10 nm.

The reason why the silicon dioxide layer 30 is formed on the silicon nitride layer 28, which is used as such a hard mask, is as described below.

Figure 3:
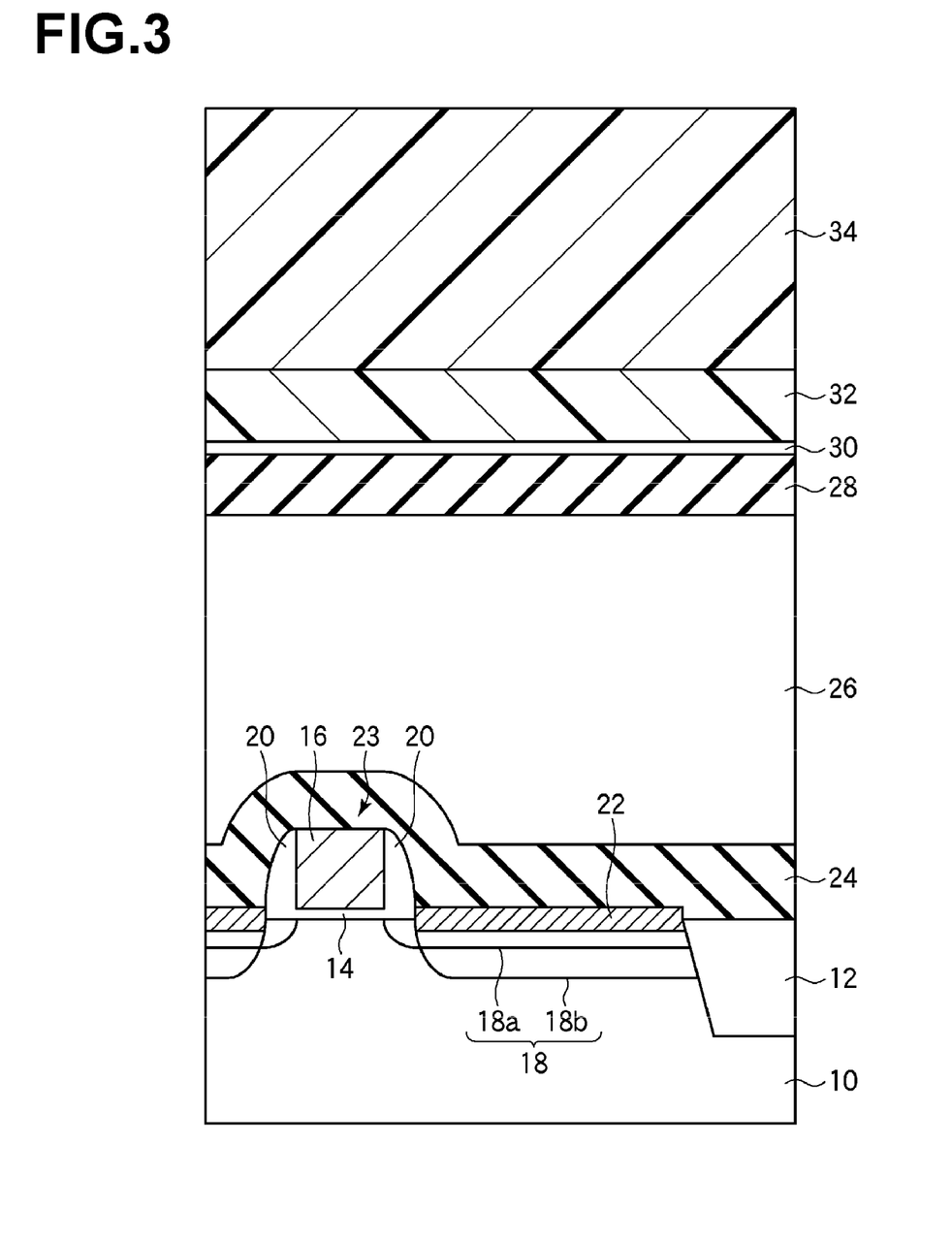
FIG. 3 is a sectional view illustrating an operation of the semiconductor device-manufacturing method.

In a subsequent operation, a photoresist layer 34 is formed above the silicon nitride layer 28 as illustrated in FIG. 3. The photoresist layer 34 is exposed to light and then developed by photolithography. If the resulting photoresist layer 34 does not meet predetermined requirements, it is necessary that the photoresist layer 34 is stripped off and another photoresist layer is formed. If the photoresist layer 34 is formed directly on the silicon nitride layer 28 without forming the silicon dioxide layer 30, the silicon nitride layer 28 may be damaged when the photoresist layer 34 is stripped off. Therefore, in this embodiment, the silicon dioxide layer 30 is formed on the silicon nitride layer 28 such that the silicon nitride layer 28 is protected when the photoresist layer 34 is stripped off. According to this embodiment, the silicon dioxide layer 30 is present on the silicon nitride layer 28 and therefore the silicon nitride layer 28 may be prevented from being damaged when the photoresist layer 34 is stripped off.

As illustrated in FIG. 3, an antireflective layer 32 is formed over the silicon dioxide layer 30 by, for example, a spin coating process. A material used to form the antireflective layer 32 is, for example, ARC29A™. The antireflective layer 32 has a thickness of, for example, 82 nm.

The photoresist layer 34 is formed over the antireflective layer 32 by, for example, a spin coating process. The photoresist layer 34 has a thickness of, for example, 200 nm.

Figure 4:
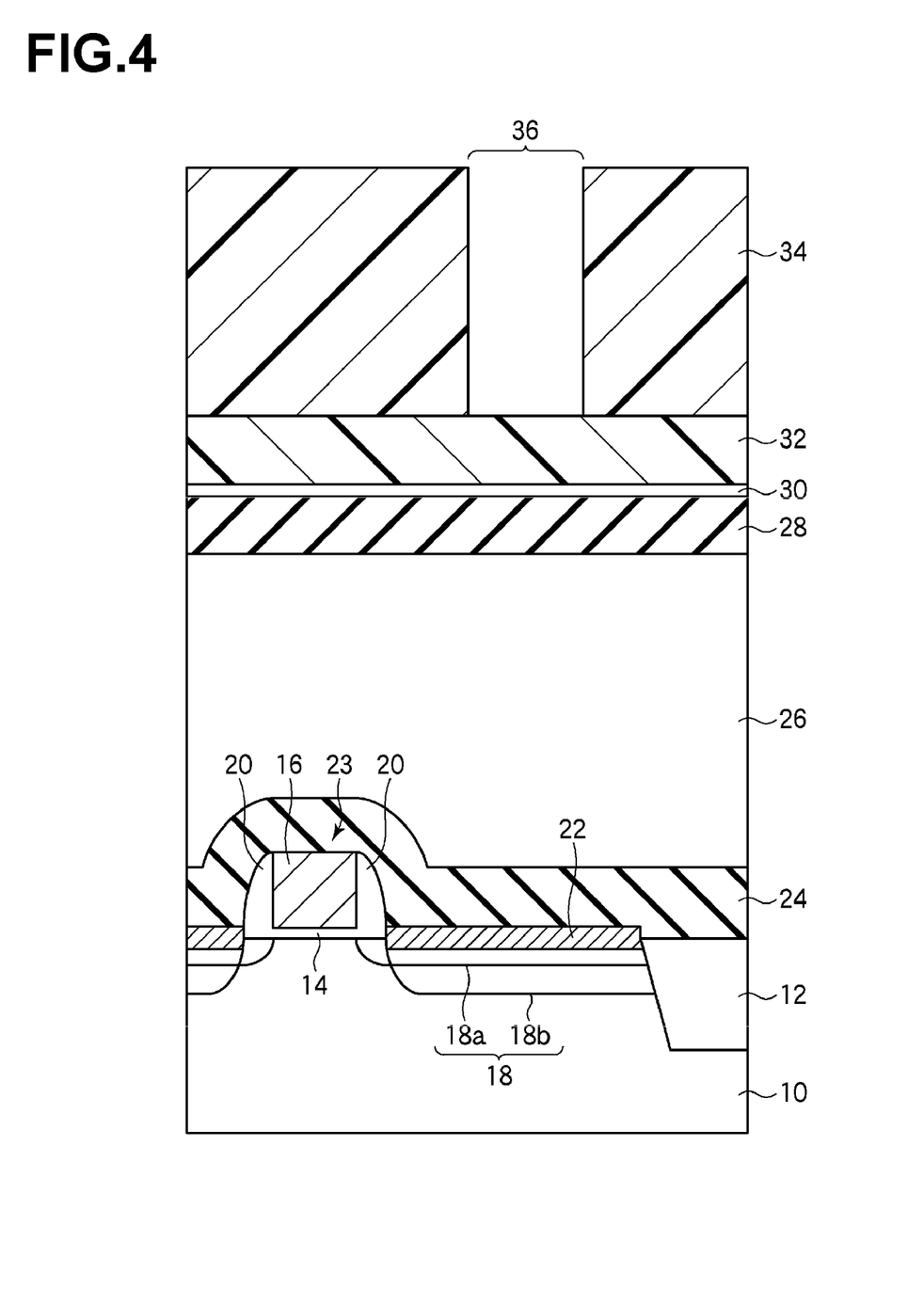
FIG. 4 is a sectional view illustrating an operation of the semiconductor device-manufacturing method.

As illustrated in FIG. 4, openings 36 are formed in the photoresist layer 34 by, for example, photolithography. The openings 36 have a diameter of, for example, about 65 nm. The openings 36 have, for example, a circular shape in plan view.

Figure 5:
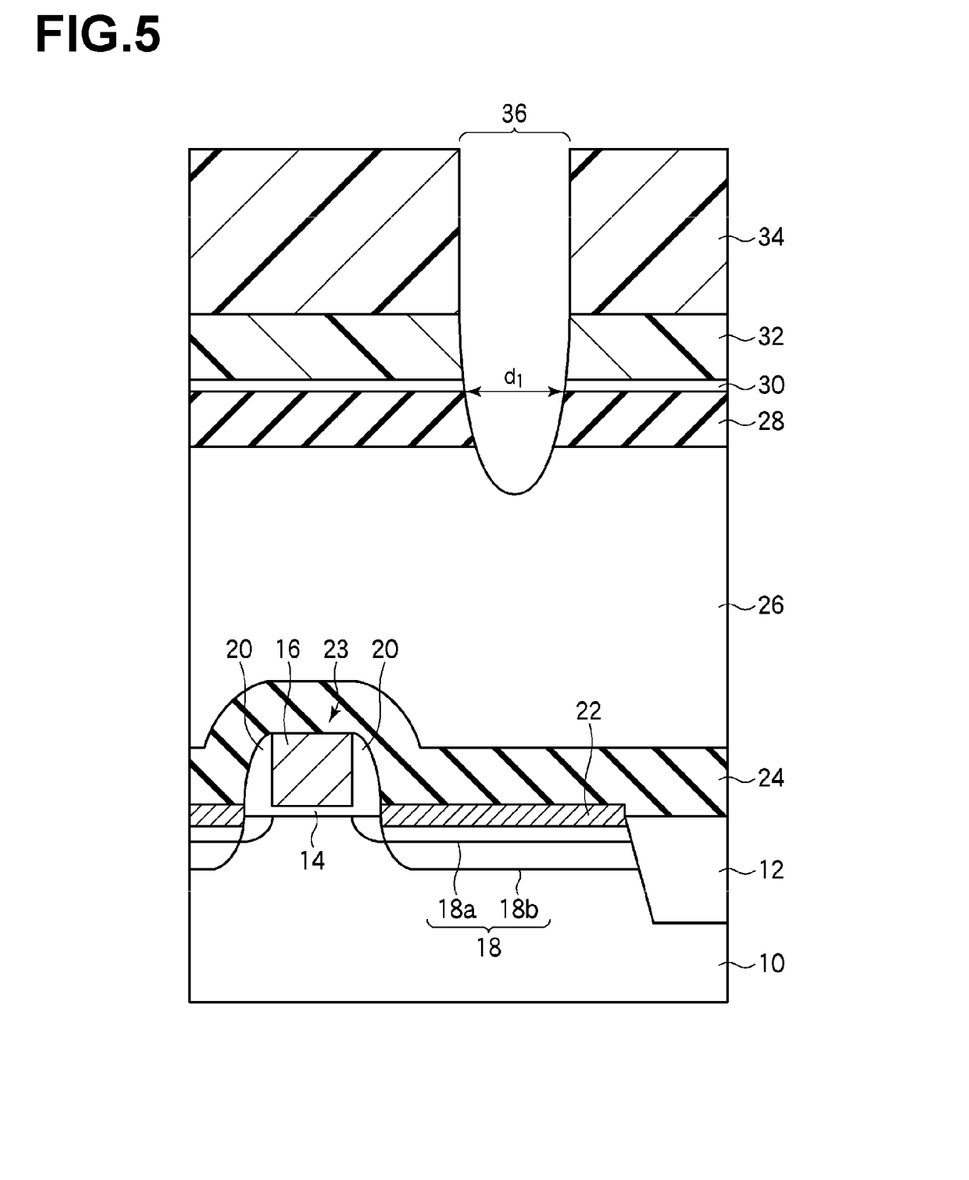
FIG. 5 is a sectional view illustrating an operation of the semiconductor device-manufacturing method.

As illustrated in FIG. 5, the antireflective layer 32, the silicon dioxide layer 30, and the silicon nitride layer 28 are etched using the photoresist layer 34 as a mask. This allows the openings 36 to reach to upper portions of the silicon dioxide layer 26. An etching gas used contains, for example, gaseous $CF_4$. The flow rate of $CF_4$ is, for example, 160 sccm. The pressure in a chamber used is, for example, 100 mTorr. An RF power used is, for example, 600 W. In the course of etching the antireflective layer 32, the silicon dioxide layer 30, and the silicon nitride layer 28, reaction products produced by etching adhere to the walls (inner walls) of the openings 36. Therefore, the openings 36 are tapered toward bottom zones thereof as illustrated in FIG. 5.

The openings 36 have zones which reach through the photoresist layer 34 and which have a diameter of, for example, 65 nm. The openings 36 also have zones formed by etching the antireflective layer 32, the silicon dioxide layer 30, and the silicon nitride layer 28 using the etching gas, which contains gaseous $CF_4$. The openings 36 also have zones which are the same height as the upper surface of the silicon nitride layer (hard mask) 28 and which have a diameter $d_1$ of, for example, 48 nm. That is, the openings 36 have an upper hole diameter $d_1$ of, for example, 48 nm. Since the antireflective layer 32, the silicon dioxide layer 30, and the silicon nitride layer 28 are etched using the etching gas, which contains gaseous $CF_4$, the zones of the openings 36 that are the same height as the upper surface of the silicon nitride layer 28 have a relatively large diameter.

The etching gas used to etch the antireflective layer 32, the silicon dioxide layer 30, and the silicon nitride layer 28 contains gaseous $CF_4$ as described above. A gas used to etch the antireflective layer 32, the silicon dioxide layer 30, and the silicon nitride layer 28 is not limited to the etching gas.

An etching gas, such as a gas mixture, containing gaseous $CF_4$ and $CHF_3$ may be used to etch the antireflective layer 32, the silicon dioxide layer 30, and the silicon nitride layer 28. This etching gas may be prepared by adding gaseous $CHF_3$ to gaseous $CF_4$.

Figure 10:
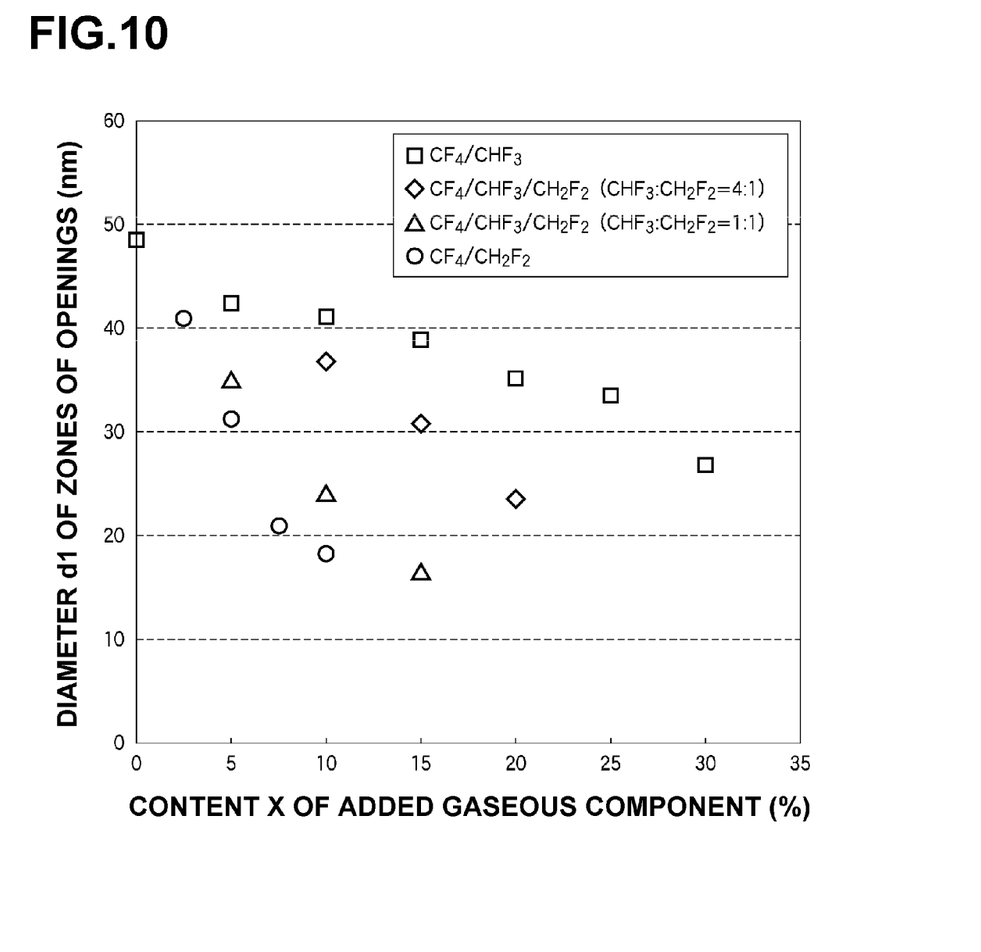
FIG. 10 is a graph illustrating the relationship between the content X of an added gaseous component in each etching gas and the diameter $d_1$ of zones of openings that are the same height as the upper surface of a silicon nitride layer.

FIG. 10 is a graph illustrating the relationship between the content X of an added gaseous component in each etching gas and the diameter $d_1$ of the zones of the openings 36 that are the same height as the upper surface of the silicon nitride layer 28.

With reference to FIG. 10, open squares indicate data obtained using etching gases prepared by adding gaseous $CHF_3$ to gaseous $CF_4$. The horizontal axis of FIG. 10 represents the content X of the added gaseous component in each etching gas and the vertical axis thereof represents the diameter $d_1$ of the zones of the openings 36 that are the same height as the upper surface of the silicon nitride layer 28.

Figure 11:
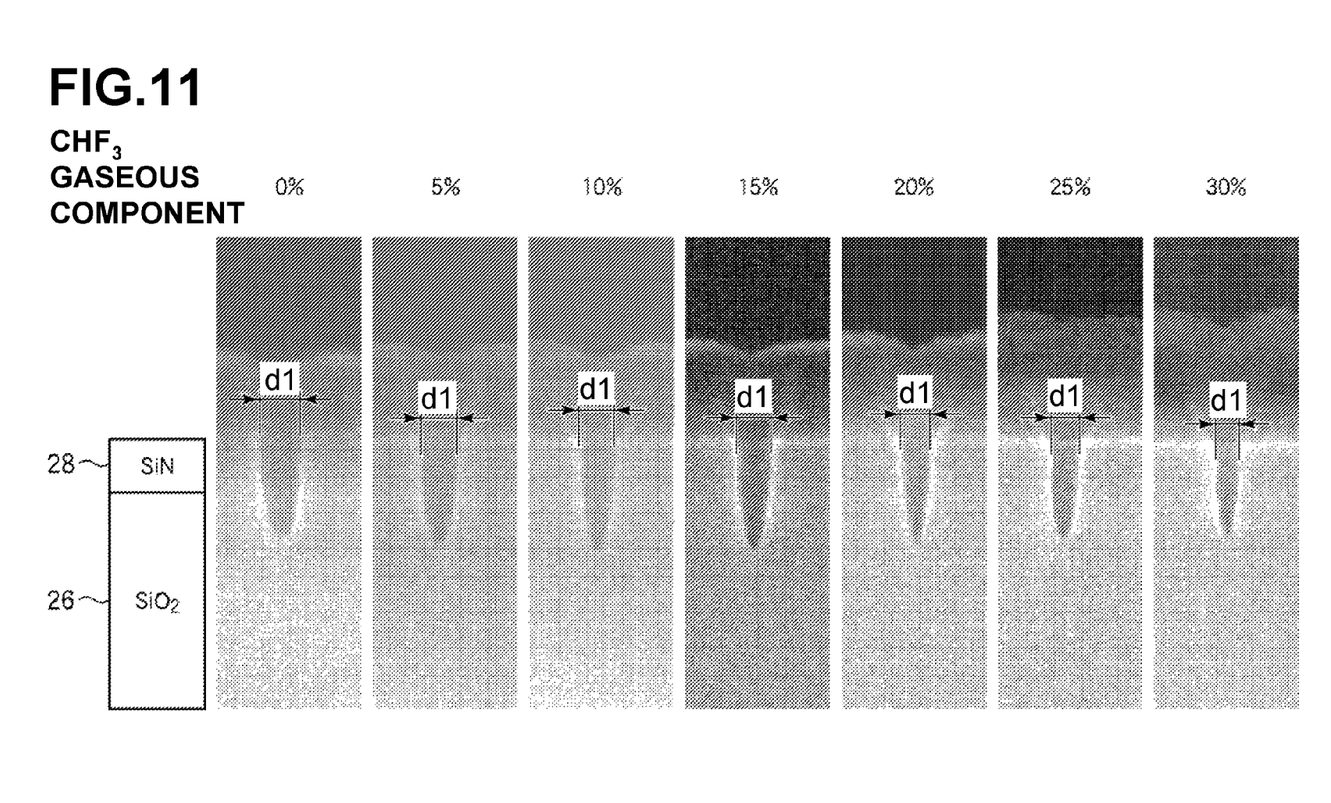
FIG. 11 is an illustration illustrating micrographs of openings formed using etching gases prepared by adding gaseous $CHF_3$ to gaseous $CF_4$.

FIG. 11 illustrates micrographs of openings formed using etching gases prepared by adding gaseous $CHF_3$ to gaseous $CF_4$. The content X of an added gaseous component (gaseous $CHF_3$) in each etching gas illustrated in FIG. 11 is 0%, 5%, 10%, 15%, 20%, 25%, or 30%.

As illustrated in FIGS. 10 and 11, an increase in the content X of the added gaseous component (gaseous $CHF_3$) in the etching gas reduces the diameter $d_1$ of the zone of each opening 36 that is the same height as the upper surface of the silicon nitride layer 28.

When the content X of gaseous $CHF_3$ in the etching gas, which is prepared by adding gaseous $CHF_3$ to gaseous $CF_4$, is greater than 40%, the diameter $d_1$ of the zone of the opening 36 that is the same height as the upper surface of the silicon nitride layer 28 is excessively small. When the diameter $d_1$ of the zone of the opening 36 that is the same height as the upper surface of the silicon nitride layer 28 is excessively small, it is difficult to form contact holes 38 such that the contact holes 38 have bottom zones having a sufficiently large diameter. When the diameter $d_1$ of the zone of the opening 36 that is the same height as the upper surface of the silicon nitride layer 28 is excessively small, it takes a long time to form the contact holes 38. When the diameter $d_1$ of the zone of the opening 36 that is the same height as the upper surface of the silicon nitride layer 28 is excessively small, it is difficult to form the contact holes 38 such that the contact holes 38 reach to the source/drain electrodes 22 of the transistor 23. Therefore, the content X of gaseous $CHF_3$ in the etching gas, which is prepared by mixing gaseous $CF_4$ and $CHF_3$ together, is preferably 40% or less.

If the etching gas, which is prepared by mixing gaseous $CF_4$ and $CHF_3$ together, is used to etch the antireflective layer 32, the silicon dioxide layer 30, and the silicon nitride layer 28, the openings 36 are tapered toward the bottom zones thereof.

The antireflective layer 32, the silicon dioxide layer 30, and the silicon nitride layer 28 may be etched with a gas mixture prepared by adding gaseous $CH_2F_2$ to gaseous $CF_4$.

With reference to FIG. 10, open circles indicate data obtained using etching gases prepared by adding gaseous $CH_2F_2$ to gaseous $CF_4$.

Figure 12:
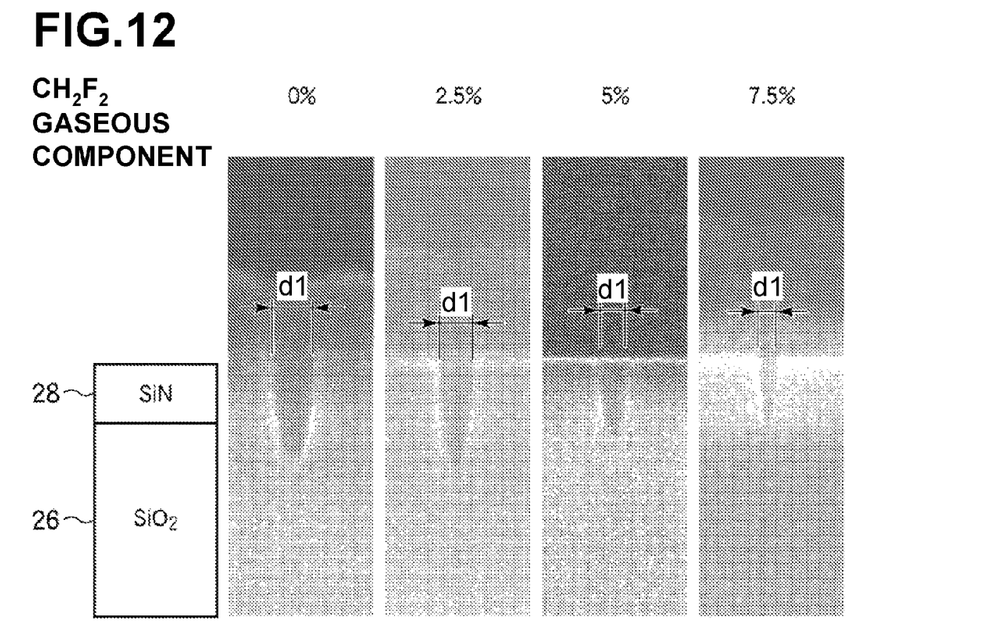
FIG. 12 is an illustration illustrating micrographs of openings formed using etching gases prepared by adding gaseous $CH_2F_2$ to gaseous $CF_4$.

FIG. 12 illustrates micrographs of openings formed using etching gases prepared by adding gaseous $CH_2F_2$ to gaseous $CF_4$. The content X of an added gaseous component (gaseous $CH_2F_2$) in each etching gas illustrated in FIG. 12 is 0%, 2.5%, 5%, or 7.5%.

As illustrated in FIGS. 10 and 12, an increase in the content X of the added gaseous component (gaseous $CH_2F_2$) in the etching gas reduces the diameter $d_1$ of the zone of the opening 36 that is the same height as the upper surface of the silicon nitride layer 28.

When the content X of gaseous $CH_2F_2$ in the etching gas, which is prepared by mixing gaseous $CH_2F_2$ and $CF_4$ together, is greater than 10%, the diameter $d_1$ of the zone of the opening 36 that is the same height as the upper surface of the silicon nitride layer 28 is excessively small. When the diameter $d_1$ of the zone of the opening 36 that is the same height as the upper surface of the silicon nitride layer 28 is excessively small, it is difficult to form the contact holes 38 (see FIG. 8) such that the contact holes 38 have a desired diameter. When the diameter $d_1$ of the zone of the opening 36 that is the same height as the upper surface of the silicon nitride layer 28 is excessively small, it takes a long time to form the contact holes 38. When the diameter $d_1$ of the zone of the opening 36 that is the same height as the upper surface of the silicon nitride layer 28 is excessively small, it is difficult to form the contact holes 38 such that the contact holes 38 reach to the source/drain electrodes 22 of the transistor 23. Therefore, the content X of gaseous $CH_2F_2$ in the etching gas, which is prepared by mixing gaseous $CF_4$ and $CH_2F_2$ together, is preferably 10% or less.

If the etching gas, which is prepared by mixing gaseous $CF_4$ and $CH_2F_2$ together, is used to etch the antireflective layer 32, the silicon dioxide layer 30, and the silicon nitride layer 28, the openings 36 are tapered toward the bottom zones thereof.

The antireflective layer 32, the silicon dioxide layer 30, and the silicon nitride layer 28 may be etched with a gas mixture prepared by adding gaseous $CH_2F_2$ and $CHF_3$ to gaseous $CF_4$.

With reference to FIG. 10, open lozenges indicate data obtained using etching gases prepared by adding gaseous $CHF_3$ and $CH_2F_2$ to gaseous $CF_4$. The ratio of the flow rate of $CHF_3$ to that of $CH_2F_2$ is 4:1.

As illustrated in FIG. 10, an increase in the content X of the added gaseous components (gaseous $CHF_3$ and $CH_2F_2$) in each etching gas reduces the diameter $d_1$ of the zone of the opening 36 that is the same height as the upper surface of the silicon nitride layer 28.

When the sum of the content X of $CHF_3$ and that of $CH_2F_2$ in the etching gas, which is prepared by mixing gaseous $CHF_3$, $CH_2F_2$, $CF_4$ together, is greater than 25%, the diameter $d_1$ of the zone of the opening 36 that is the same height as the upper surface of the silicon nitride layer 28 is excessively small. When the diameter $d_1$ of the zone of the opening 36 that is the same height as the upper surface of the silicon nitride layer 28 is excessively small, it is difficult to form the contact holes 38 (see FIG. 8) such that the contact holes 38 have a desired diameter. When the diameter $d_1$ of the zone of the opening 36 that is the same height as the upper surface of the silicon nitride layer 28 is excessively small, it takes a long time to form the contact holes 38. When the diameter $d_1$ of the zone of the opening 36 that is the same height as the upper surface of the silicon nitride layer 28 is excessively small, it is difficult to form the contact holes 38 such that the contact holes 38 reach to the source/drain electrodes 22 of the transistor 23. Therefore, the sum of the content X of $CHF_3$ and that of $CH_2F_2$ in the etching gas, which is prepared by mixing gaseous $CHF_3$, $CH_2F_2$, and $CF_4$ together, is preferably 25% or less.

With reference to FIG. 10, open triangles indicate data obtained using etching gases prepared by adding gaseous $CHF_3$ and $CH_2F_2$ to gaseous $CF_4$. The ratio of the flow rate of $CHF_3$ to that of $CH_2F_2$ is 2:1.

As illustrated in FIG. 10, an increase in the content X of the added gaseous components (gaseous $CHF_3$ and $CH_2F_2$) in each etching gas reduces the diameter $d_1$ of the zone of the opening 36 that is the same height as the upper surface of the silicon nitride layer 28.

When the sum of the content X of $CHF_3$ and that of $CH_2F_2$ in the etching gas, which is prepared by mixing gaseous $CHF_3$, $CH_2F_2$, and $CF_4$ together, is greater than 15%, the diameter $d_1$ of the zone of the opening 36 that is the same height as the upper surface of the silicon nitride layer 28 is excessively small. When the diameter $d_1$ of the zone of the opening 36 that is the same height as the upper surface of the silicon nitride layer 28 is excessively small, it is difficult to form the contact holes 38 (see FIG. 8) such that the contact holes 38 have a desired diameter. When the diameter $d_1$ of the zone of the opening 36 that is the same height as the upper surface of the silicon nitride layer 28 is excessively small, it takes a long time to form the contact holes 38. When the diameter $d_1$ of the zone of the opening 36 that is the same height as the upper surface of the silicon nitride layer 28 is excessively small, it is difficult to form the contact holes 38 such that the contact holes 38 reach to the source/drain electrodes 22 of the transistor 23. Therefore, the sum of the content X of $CHF_3$ and that of $CH_2F_2$ in the etching gas, which is prepared by mixing gaseous $CHF_3$, $CH_2F_2$, and $CF_4$ together, is preferably 15% or less.

If the etching gas, which is prepared by mixing gaseous $CF_4$, $CHF_3$, and $CH_2F_2$ together, is used to etch the antireflective layer 32, the silicon dioxide layer 30, and the silicon nitride layer 28, the openings 36 are tapered toward the bottom zones thereof.

Figure 6:
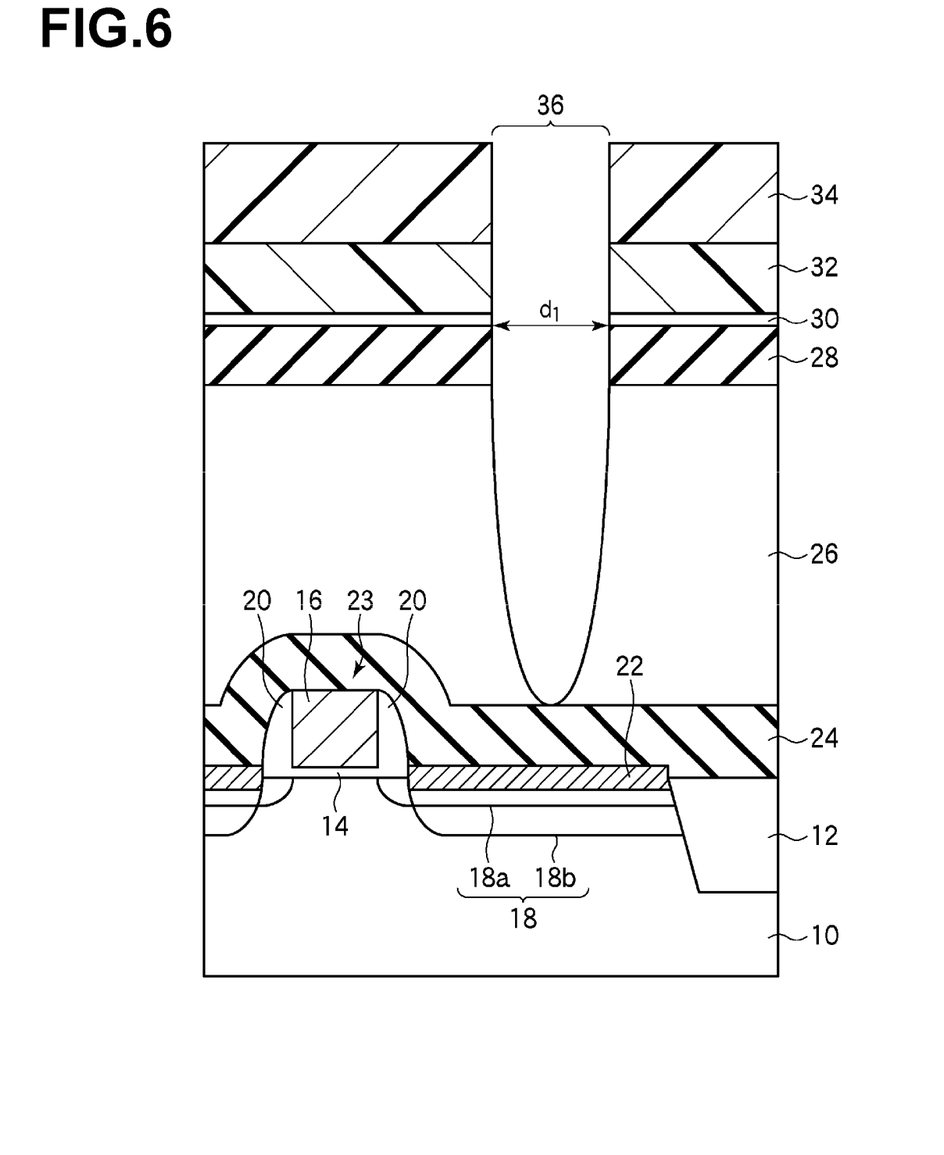
FIG. 6 is a sectional view illustrating an operation of the semiconductor device-manufacturing method.

Next, as illustrated in FIG. 6, the silicon dioxide layer 26 is etched using the silicon nitride layer (hard mask) 28 having the openings 36 as a mask such that the openings 36 reach to the silicon nitride layer 24. Isotropic dry etching is used to etch the silicon dioxide layer 26. Conditions for etching the silicon dioxide layer 26 are as described below. An etching gas used is a gas mixture of gaseous Ar, $O_2$, and $C_4F_6$. The pressure in a chamber used is, for example, 40 mTorr. An RF power used is, for example, 1,400 W. The flow rate of gaseous $O_2$ is, for example, 9 sccm. The flow rate of gaseous Ar is, for example, 600 sccm. The flow rate of gaseous $C_4F_6$ is, for example, 9 sccm. The above conditions are hereinafter referred to as Conditions 1. Under the conditions, the etching selectivity of the silicon dioxide layer 26 to the silicon nitride layer 24 is, for example, about four.

The reason why the silicon dioxide layer 26 is etched under the above conditions is that if the silicon dioxide layer 26 is etched under such conditions that the selectivity of the silicon dioxide layer 26 to the silicon nitride layer 24 is high, the contact holes 38 do not have a circular shape in plan view but have a lozenge shape in plan view and are tapered in sectional view. In this embodiment, the silicon dioxide layer 26 is etched under those conditions and therefore the contact holes 38 may be formed so as to have a desired shape in plan view and a desired shape in sectional view.

In the stage that the openings 36 are reached to the upper surface of the silicon nitride layer 28, the openings 36 are tapered toward the bottom zones thereof.

Figure 7:
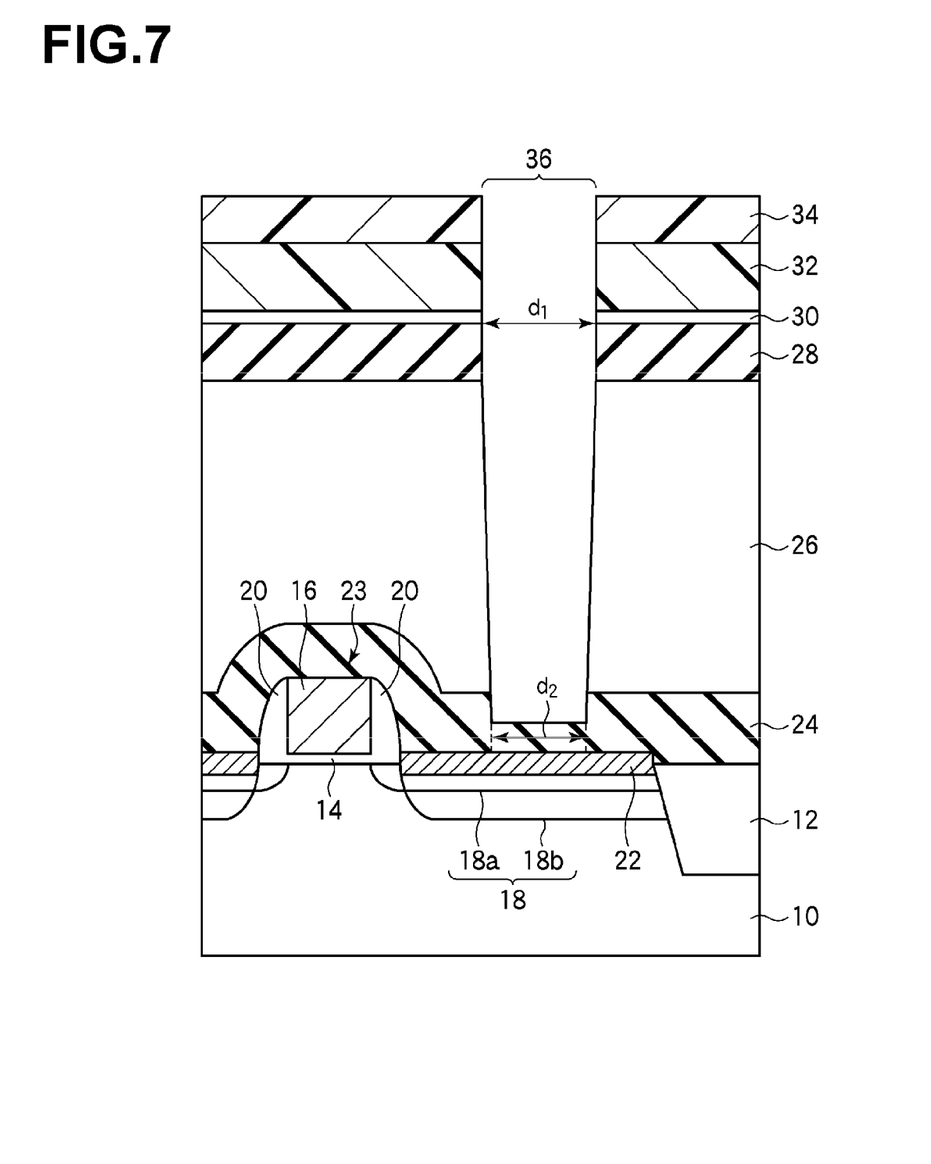
FIG. 7 is a sectional view illustrating an operation of the semiconductor device-manufacturing method.

As illustrated in FIG. 7, the silicon dioxide layer 26 is overetched, whereby the diameter $d_2$ of the bottom zones of the openings 36, that is, the lower hole diameter $d_2$ of the openings 36 is increased. During the overetching of the silicon dioxide layer 26, the silicon nitride layer 24 is also etched to some extent, that is, the silicon nitride layer 24 is etched halfway. In the overetching of the silicon dioxide layer 26, the diameter (upper hole diameter) $d_1$ of the zones of the openings 36 that are the same height as the upper surface of the silicon nitride layer (hard mask) 28 is not increased but the diameter (lower hole diameter) $d_2$ of the bottom zones of the openings 36 is increased. The diameter $d_2$ of the bottom zones of the openings 36 is controlled on the basis of the overetching amount of the silicon dioxide layer 26. In the present specification, the overetching amount of the silicon dioxide layer 26 refers to the ratio ($t_2/t_1$) of the time taken to etch the silicon dioxide layer 26 to the time taken to overetch the silicon dioxide layer 26.

Conditions for overetching the silicon dioxide layer 26 are as described below. An etching gas used is, for example, a gas mixture of gaseous Ar, $O_2$, and $C_4F_6$. The pressure in a chamber used is, for example, 40 mTorr. An RF power used is, for example, 1,000 W. The flow rate of gaseous $O_2$ is, for example, 7 sccm. The flow rate of gaseous Ar is, for example, 600 sccm. The flow rate of gaseous $C_4F_6$ is, for example, 11 sccm. The overetching selectivity of the silicon dioxide layer 26 to the silicon nitride layer 24 is, for example, eight. These conditions are hereinafter referred to as Conditions 2.

The content of $C_4F_6$ in the etching gas used to overetch the silicon dioxide layer 26 is greater than the content of $C_4F_6$ in the etching gas used to etch the silicon dioxide layer 26 using the silicon nitride layer 28 as a mask. The content Of $O_2$ in the etching gas used to overetch the silicon dioxide layer 26 is less than the content of $O_2$ in the etching gas used to etch the silicon dioxide layer 26 using the silicon nitride layer 28 as a mask. That is, the content of a CF polymer in the etching gas used to overetch the silicon dioxide layer 26 is greater than the content of a CF polymer in the etching gas used to etch the silicon dioxide layer 26 using the silicon nitride layer 28 as a mask. The reason why the content of the CF polymer in the etching gas used to overetch the silicon dioxide layer 26 is set to be relatively large is that the selectivity of the silicon dioxide layer 26 to the silicon nitride layer 24 is set to be sufficiently large.

In the operation of etching the silicon dioxide layer 26 using the silicon nitride layer 28 as a mask, the selectivity of the silicon dioxide layer 26 to the silicon nitride layer 24 is relatively small, about four as described above. On the other hand, in the operation of overetching the silicon dioxide layer 26, the selectivity of the silicon dioxide layer 26 to the silicon nitride layer 24 is relatively large, about eight.

The reason why the selectivity of the silicon dioxide layer 26 to the silicon nitride layer 24 is set to be relatively large in the operation of overetching the silicon dioxide layer 26 is as described below. If the silicon dioxide layer 26 is overetched under such a condition that the selectivity of the silicon dioxide layer 26 to the silicon nitride layer 24 is relatively small, the silicon nitride layer 24 is deeply etched when the diameter of the bottom zones of the openings 36 is increased. If the silicon nitride layer 24 is deeply etched in the overetching operation, the openings 36 reach through the silicon nitride layer 24 to the source/drain electrodes 22 and therefore the source/drain electrodes 22 may be greatly etched. Therefore, the silicon dioxide layer 26 is overetched under such a condition that the selectivity of the silicon dioxide layer 26 to the silicon nitride layer 24 is sufficiently large.

Figure 13:
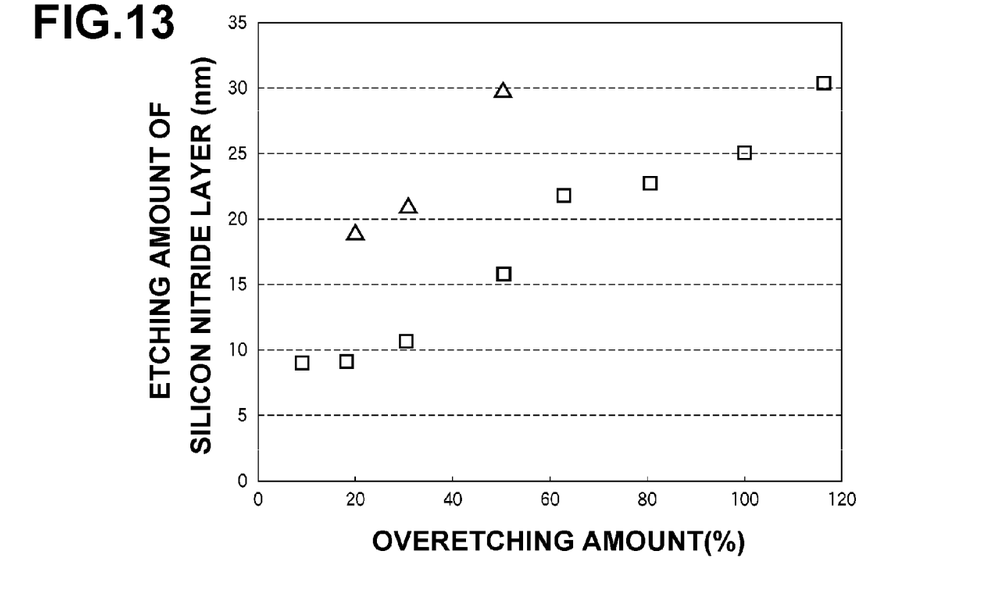
FIG. 13 is a graph illustrating the relationship between the overetching amount of a silicon dioxide layer and the etching amount of a silicon nitride layer.

FIG. 13 is a graph illustrating the relationship between the overetching amount of the silicon dioxide layer 26 and the etching amount of the silicon nitride layer 24. The horizontal axis of FIG. 13 represents the overetching amount of the silicon dioxide layer 26. The vertical axis of FIG. 13 represents the etching amount of the silicon nitride layer 24, that is, the depth of recessed portions formed in the silicon nitride layer 24. With reference to FIG. 13, open triangles indicate data obtained by overetching the silicon dioxide layer 26 under above-mentioned Conditions 1 and open squares indicate data obtained by overetching the silicon dioxide layer 26 under above-mentioned Conditions 2.

In the case where the silicon dioxide layer 26 is overetched under Conditions 1, that is, in the case where the silicon dioxide layer 26 etched under the same conditions as that for etching the silicon dioxide layer 26 using the silicon nitride layer 28 as a mask, the etching amount of the silicon nitride layer 24 is relatively large although the overetching amount of the silicon dioxide layer 26 is relatively small.

On the other hand, in the case where the silicon dioxide layer 26 is overetched under Conditions 2, the etching amount of the silicon nitride layer 24 is relatively small although the overetching amount of the silicon dioxide layer 26 is relatively large. Since the etching amount of the silicon nitride layer 24 is relatively small, the openings 36 may be prevented from reaching through the silicon nitride layer 24 even if the overetching amount of the silicon dioxide layer 26 is set to be relatively large. This is effective in preventing the source/drain electrodes 22 from being excessively etched.

Figure 14:
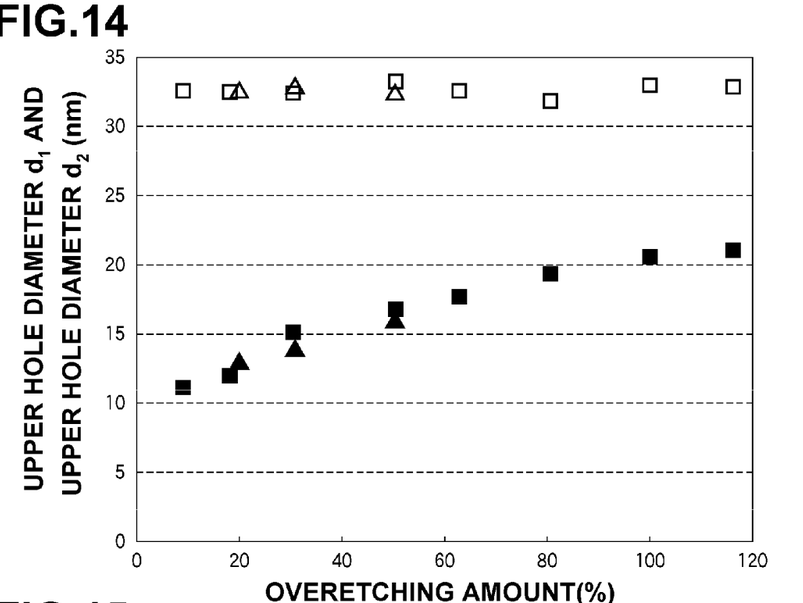
FIG. 14 is a graph illustrating the relationship between the overetching amount of the silicon dioxide layer and the upper hole diameter $d_1$ and lower hole diameter $d_2$ of the openings.

FIG. 14 is a graph illustrating the relationship between the overetching amount of the silicon dioxide layer 26 and the upper hole diameter $d_1$ and lower hole diameter $d_2$ of the openings 36. The horizontal axis of FIG. 14 represents the overetching amount of the silicon dioxide layer 26 and the vertical axis thereof represents the upper hole diameter $d_1$ and lower hole diameter $d_2$ of the openings 36.

With reference to FIG. 14, open triangles indicate the upper hole diameter $d_1$ of the openings 36 formed by overetching the silicon dioxide layer 26 under Conditions 1, filled triangles indicate the lower hole diameter $d_2$ of the openings 36 formed by overetching the silicon dioxide layer 26 under Conditions 1, open squares indicate the upper hole diameter $d_1$ of the openings 36 formed by overetching the silicon dioxide layer 26 under Conditions 2, and filled squares indicate the lower hole diameter $d_2$ of the openings 36 formed by overetching the silicon dioxide layer 26 under Conditions 2.

Figure 15:
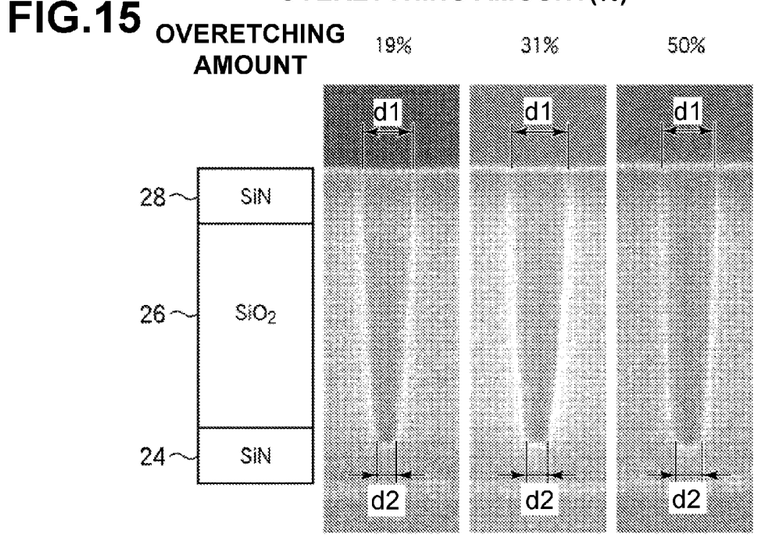
FIG. 15 is an illustration illustrating micrographs of openings formed by overetching under Conditions 1.

FIG. 15 illustrates micrographs of the openings 36 formed by overetching the silicon dioxide layer 26 under Conditions 1. The overetching amount of the silicon dioxide layer 26 illustrated in FIG. 15 is 19%, 31%, or 50%.

Figure 16:
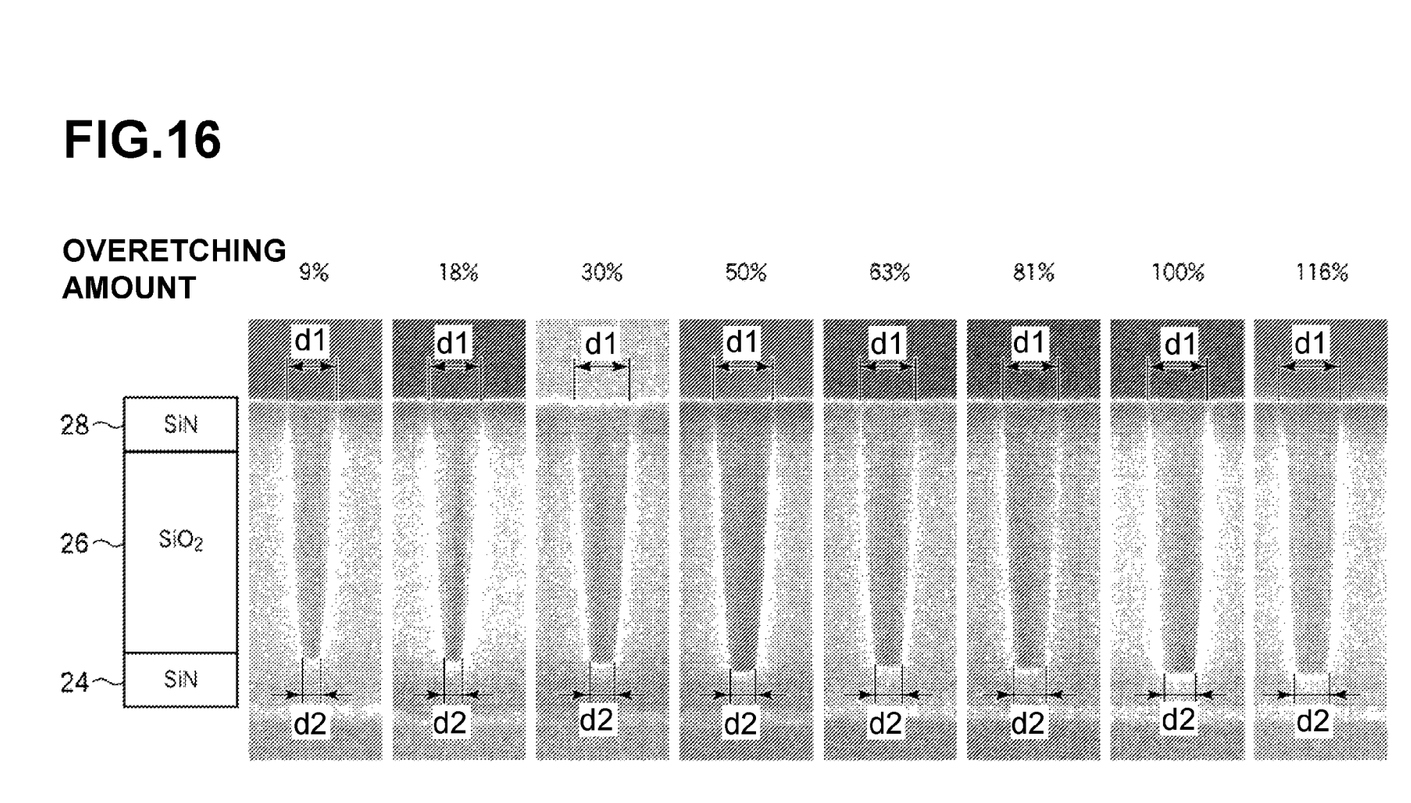
FIG. 16 is an illustration illustrating micrographs of openings formed by overetching under Conditions 2.

FIG. 16 illustrates micrographs of the openings 36 formed by overetching the silicon dioxide layer 26 under Conditions 2. The overetching amount of the silicon dioxide layer 26 illustrated in FIG. 16 is 9%, 18%, 30%, 50%, 63%, 81%, 100%, or 116%.

As is clear from FIG. 14 to FIG. 16, the lower hole diameter $d_2$ of the openings 36 increases depending on the overetching amount of the silicon dioxide layer 26. Therefore, the lower hole diameter $d_2$ of the openings 36 may be controlled on the basis of the overetching amount of the silicon dioxide layer 26.

The upper hole diameter $d_1$ of the openings 36 is substantially constant independently of the variation of the overetching amount of the silicon dioxide layer 26. This illustrates that the upper hole diameter $d_1$ of the openings 36 hardly varies during overetching.

Therefore, the diameter $d_2$ of the bottom zones of the openings 36 may be increased without increasing the diameter $d_1$ of the zones of the openings 36 that are the same height as the upper surface of the silicon nitride layer 28.

Figure 8:
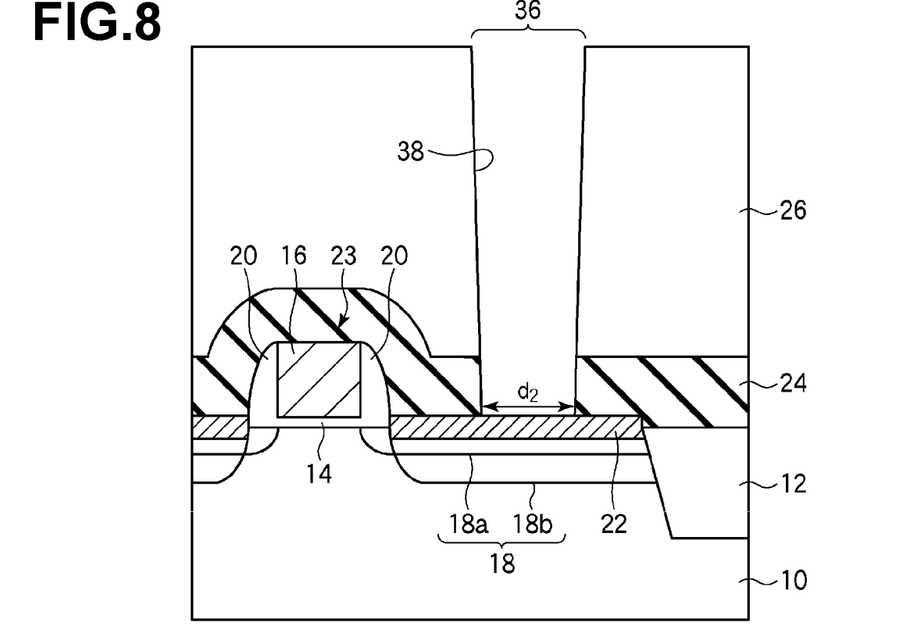
FIG. 8 is a sectional view illustrating an operation of the semiconductor device-manufacturing method.

Next, the photoresist layer 34 and the antireflective layer 32 are stripped off.

As illustrated in FIG. 8, the openings 36 are reached to the source/drain electrodes 22 in such a manner that portions of the silicon nitride layer 24 that are exposed through the openings 36 are etched off. During the etching of the silicon nitride layer 24, the silicon nitride layer 28, which is located on the silicon dioxide layer 26, is etched off. In this embodiment, since the silicon nitride layer 28, which is located on the silicon dioxide layer 26, is etched off during the etching of the silicon nitride layer 24, any independent operation of stripping off the silicon nitride layer 28 is not necessary. This is effective in preventing the increase of manufacturing cost.

The openings 36 are reached to the source/drain electrodes 22 as described above, whereby the contact holes 38 are formed so as to reach to the source/drain electrodes 22.

Figure 9:
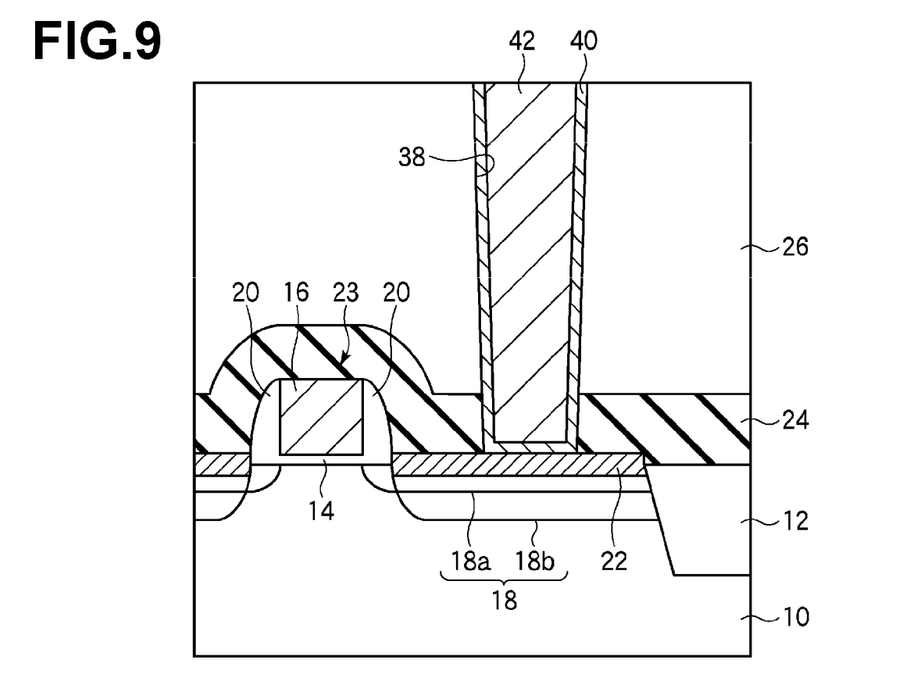
FIG. 9 is a sectional view illustrating an operation of the semiconductor device-manufacturing method.

A barrier metal layer 40 is formed over the silicon dioxide layer 26 by, for example, a sputtering process. The barrier metal layer 40 may have a multilayer structure in which, for example, a Ti layer and a TiN layer are stacked in that order. The barrier metal layer 40 has a thickness of, for example, 1 nm to 50 nm.

A conductive layer made of, for example, tungsten is formed over the barrier metal layer 40. The conductive layer has a thickness of, for example, about 500 nm.

The conductive layer is polished by chemical mechanical polishing (CMP) until the silicon dioxide layer 26 is exposed. This allows conductive plug 42 made of tungsten to be formed in the contact holes 38 as illustrated in FIG. 9.

Multi-level interconnects, which are not illustrated, are then formed.

The semiconductor device of this embodiment is obtained as described above.

According to this embodiment, after the openings 36 are reached to the silicon nitride layer 24, the diameter $d_2$ of the bottom zones of the openings 36 is increased by overetching; hence, the diameter $d_2$ of the bottom zones of the openings 36 may be sufficiently increased even if the contact holes 38 are formed so as to have a small diameter. Therefore, according to this embodiment, fine contact holes may be achieved without reducing the yield and/or reliability of products.

The present technique is not limited to the above embodiment and various modifications may be made within the scope of the present technique.

For example, conditions for etching the silicon dioxide layer 26 using the silicon nitride layer 28 having the openings 36 as a mask are not limited to those described above. The pressure in a chamber used may be, for example, 35 mTorr to 60 mTorr. An RF power used may be, for example, 800 W to 2,000 W. The flow rate of gaseous $O_2$ may be, for example, 3 sccm to 10 sccm. The flow rate of gaseous Ar may be, for example, 400 sccm to 700 sccm. The flow rate of gaseous $C_4F_6$ may be, for example, 3 sccm to 10 sccm. The pressure in the chamber used, the RF power used, the flow rate of gaseous $O_2$, the flow rate of gaseous Ar, and the flow rate of gaseous $C_4F_6$ are not limited to the above ranges and may be appropriately selected.

Conditions for overetching the silicon dioxide layer 26 are not limited to those described above. The pressure in a chamber used may be, for example, 30 mTorr to 50 mTorr. An RF power used may be, for example, 800 W to 2,000 W. The flow rate of gaseous $O_2$ may be, for example, 3 sccm to 12 sccm. The flow rate of gaseous Ar may be, for example, 400 sccm to 700 sccm. The flow rate of gaseous $C_4F_6$ may be, for example, 4 sccm to 15 sccm. The pressure in the chamber used, the RF power used, the flow rate of gaseous $O_2$, the flow rate of gaseous Ar, and the flow rate of gaseous $C_4F_6$ are not limited to the above ranges and may be appropriately selected.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modification and equivalents may be resorted to, falling within the scope thereof.

What is claimed is:

1. A method of manufacturing a semiconductor device, comprising:
   forming a first nitride layer over a substrate;
   forming a first oxide layer on the first nitride layer;
   forming a second nitride layer on the first oxide layer;
   forming a photoresist layer over the second nitride layer;
   forming an opening in the photoresist layer;
   etching the second nitride layer by using the photoresist layer as a mask such that the opening reaches the first oxide layer;
   etching the first oxide layer by using the second nitride layer as a mask such that the opening reaches the first nitride layer;
   etching the first oxide layer such that a bottom zone of the opening is increased in diameter; and
   etching the first nitride layer by using the first oxide layer as a mask such that the opening reaches the substrate thereby to form a contact hole reaching to the substrate;
   wherein a content rate of CF polymer in an etching gas used in the etching of the first oxide layer such that the bottom zone of the opening is increased in diameter is greater than a content rate of CF polymer in an etching gas used in the etching of the first oxide layer by using the second nitride layer as a mask such that the opening is reached to the first nitride layer.

2. The method according in claim 1, wherein the forming the first nitride layer over the substrate is performed by forming a transistor on the substrate, and forming the first nitride layer over the transistor and the substrate, and wherein the etching the first nitride layer is performed such that the contact hole reach to a source and/or drain electrode of the transistor.

3. The method according to claim 1, wherein the etching the first oxide layer such that bottom zone of the opening is increased in diameter etches off the bottom zone of the opening in diameter without varying the diameter of zone of the opening that are the same diameter as the upper surface of the second nitride layer.

4. The method according to claim 1, further comprising forming a second oxide layer on the second nitride layer after the forming the second nitride layer on the first oxide layer and before the forming the photoresist layer over the second nitride layer, and
   wherein the etching the second nitride layer is performed by etching the second oxide layer and the second nitride layer using the photoresist layer as a mask.

5. The method according to claim 1, wherein a diameter of a bottom zone of the opening is controlled in the etching the first oxide layer such that bottom zone of the opening is increased in diameter on the basis of etching amount of the first oxide layer.

6. The method according to claim 1, wherein the selectivity of the first oxide layer to the first nitride layer etched in the etching of the first oxide layer such that the bottom zone of the opening is increased in diameter is greater than the selectivity of the first oxide layer to the first nitride layer etched in the etching of the first oxide layer by using the second nitride layer as a mask such that the opening is reached to the first nitride layer.

7. The method according to claim 1, wherein the etching the second nitride layer is performed by applying an etching gas including $CF_4$, an etching gas including mixing gaseous $CF_4$ and $CHF_3$, an etching gas including mixing gaseous $CF_4$ and $CH_2F_2$, or an etching gas including mixing gaseous $CF_4$, $CHF_3$, and $CH_2F_2$ is applied to the etching the second nitride layer.

8. The method according to claim 1, wherein the etching the second nitride layer is performed such that the opening is tapered toward the bottom zone of the opening.

9. The method according to claim 1, wherein the first nitride layer is a first silicon nitride layer, the first oxide layer is a first silicon dioxide layer, and the second nitride layer is a second silicon nitride layer.

10. The method according to claim 1, wherein the etching the first nitride layer is performed such that the second nitride layer is etched off while the etching the first nitride layer is performed to etch the first nitride layer.

* * * * *